United States Patent
Masias

(10) Patent No.: US 9,625,530 B2
(45) Date of Patent: Apr. 18, 2017

(54) RESISTANCE BASED METHOD AND SYSTEM TO ASSESS VEHICLE COMPONENT INTEGRITY

(71) Applicant: Ford Global Technologies, LLC, Dearborn, MI (US)

(72) Inventor: Alvaro Masias, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 261 days.

(21) Appl. No.: 14/226,749

(22) Filed: Mar. 26, 2014

(65) Prior Publication Data

US 2015/0276883 A1     Oct. 1, 2015

(51) Int. Cl.
| | | |
|---|---|---|
| G01R 31/02 | (2006.01) | |
| G01R 31/36 | (2006.01) | |
| G01R 27/14 | (2006.01) | |
| G01R 31/00 | (2006.01) | |

(52) U.S. Cl.
CPC ....... *G01R 31/3627* (2013.01); *G01R 31/021* (2013.01); *G01R 27/14* (2013.01); *G01R 31/007* (2013.01)

(58) Field of Classification Search
CPC .................................. G01R 31/3627–31/3662
USPC .......................................... 324/425–437, 543
See application file for complete search history.

(56) References Cited

U.S. PATENT DOCUMENTS

| | | |
|---|---|---|
| 4,804,906 A | 2/1989 | Hamberg et al. |
| 6,872,480 B2 | 3/2005 | Keller et al. |
| 8,168,315 B1 * | 5/2012 | Hermann ............ H01M 10/482 324/500 |
| 2004/0090195 A1 * | 5/2004 | Motsenbocker ........ B63B 43/18 318/109 |
| 2010/0136389 A1 * | 6/2010 | Takagi ................ H01M 10/425 429/61 |
| 2010/0302051 A1 * | 12/2010 | Hermann ............ H01M 10/486 340/636.11 |
| 2011/0106280 A1 * | 5/2011 | Zeier ..................... H01M 10/42 700/90 |
| 2011/0264316 A1 * | 10/2011 | McCabe ............... B66F 17/003 701/22 |
| 2012/0187784 A1 * | 7/2012 | Hamer ................ H01M 2/1022 310/71 |
| 2012/0256569 A1 * | 10/2012 | Kawahara ........... H01M 10/486 318/139 |

(Continued)

FOREIGN PATENT DOCUMENTS

DE     102012001594 A1     8/2013

OTHER PUBLICATIONS

Merriam Webster Definition of Breach, 2016.*

(Continued)

*Primary Examiner* — Patrick Assouad
*Assistant Examiner* — Demetrius Pretlow
(74) *Attorney, Agent, or Firm* — James P. Muraff; Neal, Gerber & Eisenberg LLP

(57) ABSTRACT

Example embodiments provide systems and methods for a vehicle component structural integrity assessment system, comprising a first connection and a second connection coupled to a conduction path, which is associated with a vehicle component. The conduction path has an initial resistance. A controller is configured to transmit a signal upon the detection of a change in the resistance of the conduction path from the initial resistance.

20 Claims, 5 Drawing Sheets

(56) References Cited

U.S. PATENT DOCUMENTS

| | | | |
|---|---|---|---|
| 2012/0286945 A1* | 11/2012 | Lev | G01R 31/04 340/438 |
| 2013/0069789 A1 | 3/2013 | Pieler | |
| 2013/0183552 A1* | 7/2013 | Yang | H01M 2/1077 429/51 |
| 2013/0187671 A1* | 7/2013 | Widhalm | G01R 31/36 324/691 |
| 2014/0234739 A1* | 8/2014 | Sachs | H01M 8/0432 429/433 |
| 2015/0090175 A1* | 4/2015 | Mori | B63G 8/001 114/331 |
| 2015/0185290 A1* | 7/2015 | Watanabe | G01R 31/3624 702/63 |
| 2015/0232087 A1* | 8/2015 | Masuda | B60W 20/50 701/22 |
| 2015/0329199 A1* | 11/2015 | Golborne | B64C 13/18 244/196 |

OTHER PUBLICATIONS http://students.chem.tue.nl/ifp07/texts/resistance.htm, Crack Detection by Electric Resistance Change Method, Jan. 20, 2004.
http://www.sciencedirect.com/science/article/pii/s0266353805004537, Matrix crack detection of CFRP using electrical resistance change with integrated surface probes, vol. 66; Issues: 11-12; Publication Date: Sep. 2006; pp. 1539-1545.

\* cited by examiner

RESISTANCE BASED METHOD AND SYSTEM TO ASSESS VEHICLE COMPONENT INTEGRITY

TECHNICAL FIELD

This application generally relates to electric and/or hybrid vehicles and more specifically, to determining structural integrity of structurally important surfaces of various vehicle components within the electric and/or hybrid vehicles.

BACKGROUND

Electrified vehicles commonly require the usage of various vehicle components such as, for example, high voltage (HV) battery systems. HV battery systems for electric and/or hybrid vehicles typically include one or more high voltage batteries to provide the energy required by the drive systems of such vehicles. For vehicle voltage buses, a common divider between low and high voltages is 60V DC or 30V AC. This line typically determines whether the battery is ground to the chassis (i.e., less than 60 VDC) or isolated to float (i.e., greater than 60 VDC). From time to time, vehicle component integrity, such as HV battery pack integrity, may be compromised. Thus, confirming the structural well-being of vehicle components, such as the HV battery system may be desirable. For the HV battery systems, like many vehicle components, it is often difficult to quickly determine the battery integrity.

In view of this technical problem, some vehicular systems include a method to assess the structural integrity of certain vehicle components remotely. For some vehicular systems, the practical solution is to monitor the structural integrity of the outer enclosure or casing of the vehicle component. For example, in certain vehicular systems the structural integrity of the HV battery enclosure or case is monitored to assess the physical state of the battery itself.

One method of assessing the structural integrity of the outer enclosures of vehicle components includes coupling various sensors to the surface of the enclosures and monitoring changes in mechanical pressure, the electrical conductivity or insulation resistance of the enclosure through the sensors. In such systems, the signal from the sensors alerts the vehicular system of a change and the system can shut down the vehicle component.

The drawback of such systems is that the sensors can only send a signal reflecting some kind of change. The placement of sensors alone does not allow the vehicular system to determine the severity of the change and the appropriate response. In certain circumstances, it is not necessary to shut down the entire system or to shut down the vehicle component. However, signals from the various sensors alone do not provide enough information to determine what kind of change is occurring in which location. The embodiments of the present disclosure are provided to solve these and other problems.

SUMMARY

This disclosure is defined by the appended claims. The description summarizes aspects of the embodiments and should not be used to limit the claims. Other implementations are contemplated in accordance with the techniques described herein, as will be apparent to one having ordinary skill in the art upon examination of the following drawings and detailed description, and such implementations are intended to within the scope of this application.

The present disclosure is intended to solve at least the above-noted technical problems by providing a system and method to remotely, safely and effectively assess the mechanical integrity of vehicle components of electrified vehicles in one embodiment, by associating a network of conduction paths to the vehicle component and monitoring changes in resistance.

Various embodiments of the present disclosure provide a method and apparatus for assessing the mechanical integrity of various vehicle components of an electrified vehicle based on the principle that the resistance varies as a function of (1) the length between two points, (2) the resistively of the conduction path material, and (3) the area of the path of conduction. This solution could be applied practically by creating and applying preferred electrical paths for conduction to the vehicle components and monitoring the preferred electrical paths as a detection method of mechanical breach or distortion of the enclosure. More specifically, various embodiments of the present disclosure include a network of conduction paths that are associated with a vehicular surface such as a battery case and resistance sense lines added at various connections of the network of conduction paths.

By placing various conduction paths along strategically important locations based on the battery mounting location in the vehicle, the method of the present disclosure enables the vehicular system to triangulate the location and the extent of any compromise to the structural integrity of the vehicle component to more appropriately respond. This information would be feedback to the control module of the vehicular system to determine if the resistance change was minor and unimportant (i.e., scratching near the mounting brackets) or major and respond appropriately.

Example embodiments provide systems and methods for a vehicle component structural integrity assessment system, comprising a first connection and a second connection coupled to a conduction path, which is associated with a vehicle component. The conduction path has an initial resistance. A controller is configured to transmit a signal upon the detection of a change in the resistance of the conduction path from the initial resistance.

BRIEF DESCRIPTION OF THE DRAWINGS

For a better understanding of the invention, reference may be made to embodiments shown in the following drawings. The components in the drawings are not necessarily to scale and related elements may be omitted so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1A:
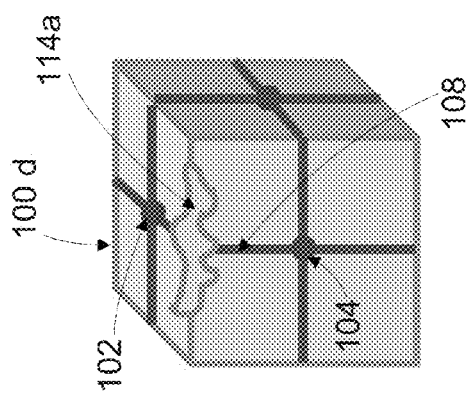
FIG. 1A-FIG. 1D depicts views of an example of a vehicle component according to embodiments.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects.

Various embodiments of the present disclosure include a method and apparatus for assessing the structural integrity of vehicle components with structurally important surfaces of an electrified vehicle. One such vehicle component is a High Voltage (HV) battery system. HV battery systems for electric and/or hybrid vehicles typically include one or more HV batteries to provide the energy required by the drive systems of such vehicles. Battery packs are contained within a protective case or enclosure. The battery pack enclosure protects from the potential for a high voltage presence on an electrical network of the vehicle (e.g., a vehicle bus). Typical battery cases are thin gauge stamped steel. If the structural integrity of the HV battery case is compromised, that may indicate a compromise in the structural integrity of the HV battery pack.

In one embodiment of the present disclosure, to determine the structural integrity of a vehicle component, such as a HV battery, it is possible to use basic principles of electrical resistance. Resistance varies as a function of (1) the length between two points, (2) the resistively of the conduction path material, and (3) the area of the path of conduction. Accordingly, if the length of the conduction path between two points changes, the resistance between those two points changes. Similarly, if the resistivity of the conduction path changes, so would the resistance. Additionally, the area of the path of conduction is the cross sectional area of the conduction path material. In the initial implementation of the invention, those surface areas should be identical, but any change in that surface area impacts the surface resistance measurements.

Various embodiments of the present disclosure include applying a network of conductive paths between multiple connections, such as sensors or wires. The connections are used to measure the resistance of the conductive paths between two connections along various locations on the battery case. This creates a network for resistance sense lines that measure the resistance of the respective conductive paths. Each conductive path has an initial resistance reading. Thereafter, the existing resistance is monitored periodically for each conductive path and the existing resistance measurement is output through a vehicle data bus to a vehicle system control module. The existing resistance is the resistance at a particular point in time after the initial resistance measurement is taken. A processor within the vehicle system control module compares the existing resistance of the conduction path to the initial resistance of the conduction path. If there is a change in the resistance, a processor within the control module transmits the appropriate signal to the relevant components of the vehicle system.

An enclosure breach is any compromise to the structural integrity of the enclosure that is being monitored, such as for example the HV battery case. If the structural integrity of the enclosure is compromised, the respective conduction path applied to the affected area of the enclosure will also be affected. For example, if the case is distorted, the conduction path will also be distorted, which will affect the length and/or cross sectional area of the conduction path, and accordingly the resistance of that conduction path. Similarly, if the enclosure is punctured, the conduction path will be punctured which will also result in a resistance change such as an open circuit reading. Thus, the resistance of the conduction path is useful in indicating the nature of any compromise to the structural integrity of a vehicle component enclosure.

FIGS. 1A-1D illustrate four views of an example embodiment of the present disclosure, each view highlighting different components of the present disclosure. In this example embodiment, the vehicle component is an HV battery system and block 100a, 100b, 100c, and 100d represent different views of the same battery case surrounding the HV batteries. Thus, 100a represents an HV battery case. Battery cases are typically made of thin gauge sheet stamped steel. One possible implementation of the invention would be to spray coat an insulator coating on the enclosure and then apply conduction paths.

Figure 1B:
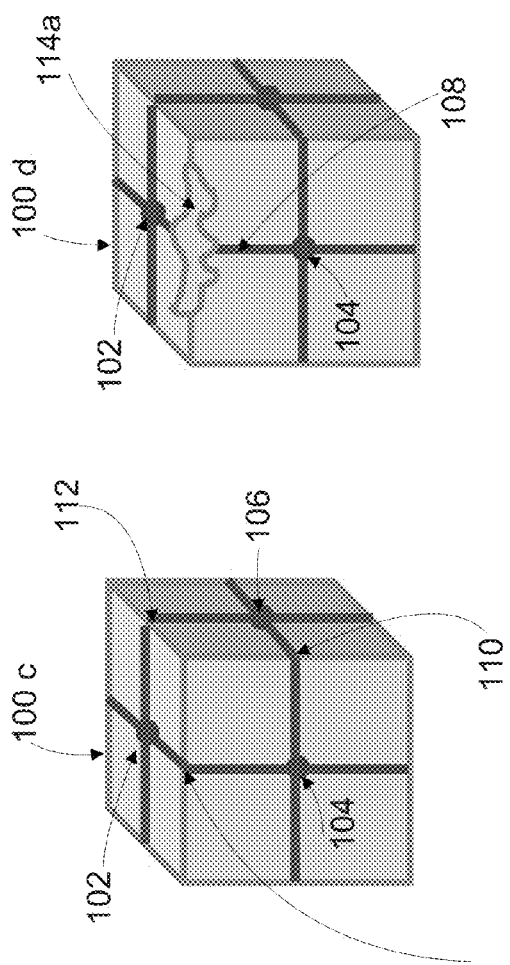

As shown in FIG. 1B, 100b represents the battery case with connections, indicated by numerals 102, 104, and 106. In this embodiment, the connections are coupled to the exterior surface of the battery case at various locations. It should be appreciated that in this example embodiment, there is one connection at the center of each of the six surfaces of the enclosure. In certain alternative embodiments, the quantity and location of the connections can be different from the example embodiment described herein. Various alternative embodiments of the present disclosure include coupling the sensors to the inside surface of the casing as opposed to outside the casing. Or placing the sensors near or next to the surface instead of on top or inside of the surface.

Figure 1C:
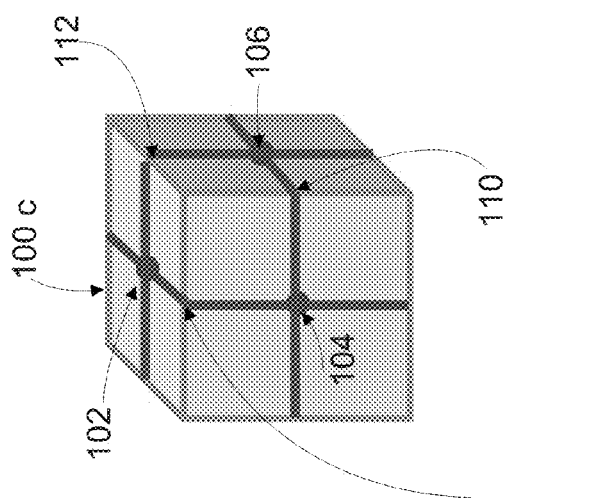

As shown in FIG. 1C, 100c represents the battery case with conduction paths, 108, 110 and 112. In this embodiment, the conduction paths are coupled to the exterior surface of the battery enclosure. It should be appreciated that in various alternative embodiments, the conduction paths are coupled to the interior surface of the battery enclosure. In certain other embodiments, the conduction paths are associated with but not coupled to either surface of the vehicle component enclosure. It should also be appreciated that in certain alternative embodiments, the connections are not coupled to the surface of the vehicle component at all, but rather are coupled to the conduction paths.

Connections are used to transmit the resistance measurements. Some examples of connections include sensors or wires connected to an ohmmeter. Each conduction path is made of conductive material that extends from a first connection to a second connection. For example, conduction path 108 extends from connection 102 to 104. The resistance of each conduction path is measured between a first connection and a second connection. In this embodiment, the resistance of conduction path 108 is measured from connection 102 and 104. A conduction path can be any path of conductive material applied to the inductive casing of the vehicle component such as, for example, a wire, a region of metallic spray, metalicized paste, non-metallic materials such as carbon, or conductivity glue. It should be appreciated that in certain alternative embodiments, the entire casing of the vehicle component is coated with a conductive material and then an insulator is applied to the battery casing to create specific conductive paths between connections.

Figure 1D:
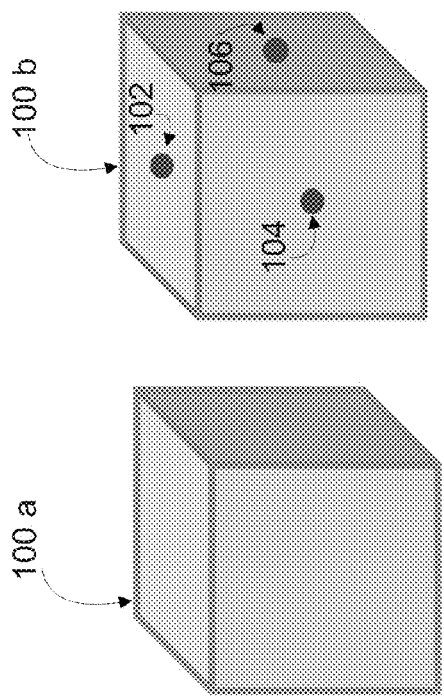

As shown in FIG. 1D, 100d represents the HV battery case, which has been compromised as indicated by the enclosure breach 114a. As illustrated by block 100d, the enclosure breach 114a disrupts the conduction path 108 between connections 102 and 104. This change in the conduction path 108 results in a change in the resistance measured between connections 102 and 104.

Turning to FIGS. 2A, 2B, 2C, and 2D, which further illustrate the impact on the resistance from the enclosure breach of the HV battery case. Using the example embodiment described above with respect to FIG. 1, FIGS. 2A, 2B, 2C, and 2D further depict the conduction path 108, between connection 102 and connection 104 under different circumstances. As discussed above, resistance varies as a function of the (1) length, (2) resistivity, and (3) cross sectional area of the conduction path. More specifically, resistance is equal to resistivity of the conduction path multiplied by the length of the conduction path divided by the cross sectional area of the conduction path, or $R=(\rho \times L)/A$.

Figure 2A:
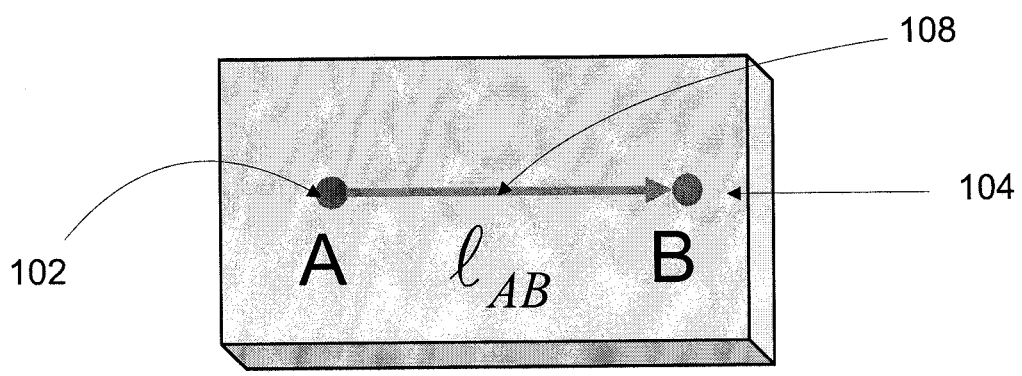
FIG. 2A-FIG. 2D depicts views of an example of a vehicle component according to embodiments.

Turning to FIG. 2A, which illustrates conduction path 108 prior to any enclosure breach. In this embodiment, the resistivity of the conduction path is $\rho$ and the cross sectional area of the conduction path is A. As depicted in FIG. 2A, the length of the conduction path is $L_{AB}$. Therefore, the conduction path 108 has an initial resistance $R_{AB}$ or the length from point A to point B ($L_{AB}$), multiplied by the resistivity ($\rho$) divided by the cross sectional area (A) of the conduction path.

Figure 2B:
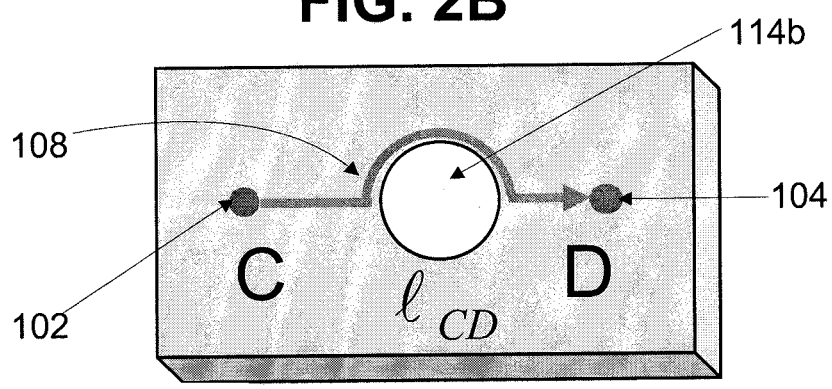

Turning to FIG. 2B, which illustrates the same conduction path 108 from FIG. 2A between connections 102 and 104. In this embodiment, the circle 114b in FIG. 2B represents a breach in the battery case, and accordingly a breach in the conduction path. The breach 114b represents a structural compromise in the integrity of the enclosure. In this example embodiment, the breach 114b changes the conduction path, but does not break the conduction path. In this example embodiment, the length of the conduction path in FIG. 2B is greater than the length of the conduction path in FIG. 2A. More specifically, in this example embodiment, the length of the conduction path in FIG. 2B, from point C to point D, represented by $L_{CD}$, extends from connection 102 to connection 104, which continues around the breach 114b. Thus, the length $L_{CD}$ is greater than the length of the conduction path in FIG. 2A, $L_{AB}$. Accordingly, because the cross sectional area (A) and the resistivity ($\rho$) of the conduction path 108 is the same in FIG. 2B as in FIG. 2A, the only change is that the length of the conduction path in FIG. 2B is greater than the length of the path in FIG. 2A. Thus, as illustrated in FIG. 2B, the resistance of the conduction path in FIG. 2B is greater than the resistance in the conduction path in FIG. 2A.

Figure 2C:
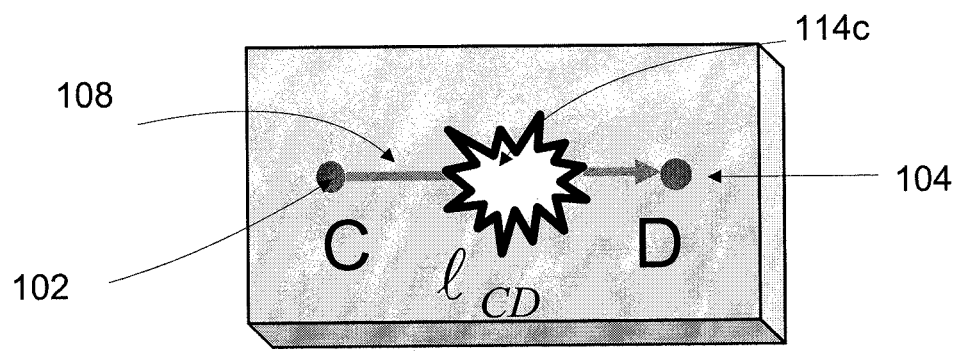

Turning to FIG. 2C, which illustrates the same conduction path 108 from FIGS. 2A and 2B, with a different breach in the enclosure 114c. In FIG. 2B, the breach in the enclosure 114b represented a breach such as a dent in the battery case, which distorted the conduction path as illustrated by the continuous conduction path 108. In FIG. 2C, the breach in the enclosure 114c represents a puncture or a hole in the battery case and therefore creates a break or a gap in the conduction path 108. A gap in the conduction path results in an open circuit. Thus, the change in resistance from the initial resistance to an open circuit indicates a break in the conduction path associated with a break or a puncture in the enclosure.

Figure 2D:
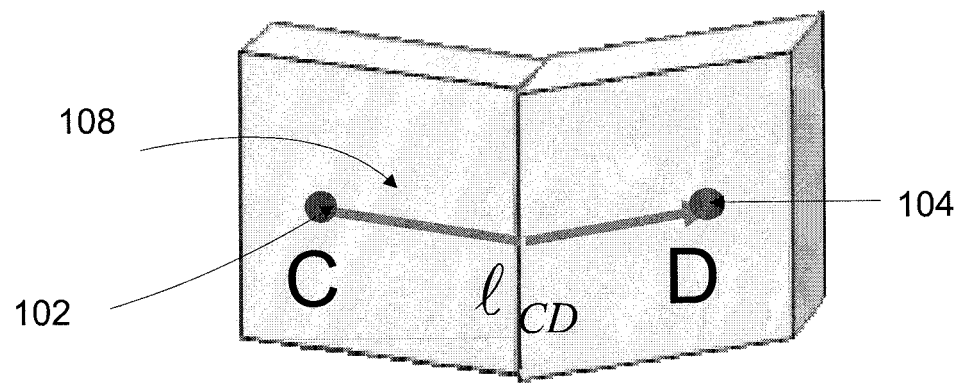

Turning to FIG. 2D, which illustrates the same conduction path 108 from FIGS. 2A, 2B, and 2C, with a different breach in the enclosure, 114d. In the embodiment depicted in FIG. 2D, the enclosure is dented. Thus, the length from point C to point D increases. With the length, the resistance increases. More specifically, in this example embodiment, the length of the conduction path from point C to point D, represented by $L_{CD}$, extends from connection 102 to connection 104, which continues along the dented enclosure. Thus, the length $L_{CD}$ is greater than the length of the conduction path in FIG. 2A, $L_{AB}$. Accordingly, because the cross sectional area (A) and the resistivity ($\rho$) of the conduction path 108 is the same in FIG. 2D as in FIG. 2A, the only change is that the length of the conduction path in FIG. 2D is greater than the length of the path in FIG. 2A. Thus, as illustrated in FIG. 2D, the resistance of the conduction path in FIG. 2B is greater than the resistance in the conduction path in FIG. 2A.

It should be appreciated that in the example embodiments described above, the cross-sectional area is constant. When the conduction paths are initially applied to the surface of a vehicle component, the cross sectional surface areas should be identical. However, to detect a scratch or mild surface bend, it is possible this surface area of the conduction path could change and become relevant. In the case of a distortion, it would come from an area change rather than length change because a pinch or electronic choke point would be created.

It should be appreciated from the example embodiment in FIGS. 2A, 2B, 2C and 2D that monitoring the resistance associated with key locations of the surface of the battery case is useful in detecting changes, such as a breach, in the surface of the battery case. It should also be appreciated that increasing the number of conduction paths increases the surface area covered on the enclosure and enables triangulation of breaches. By storing the initial resistance of the conduction path during manufacture or installation and comparing stored initial resistance with the existing resistance of the conduction path, any changes in resistance alert the vehicle system as to potential breaches in the structural integrity of the vehicle component.

It should also be appreciated that the example embodiments illustrated by FIGS. 1A, 1B, 1C, 1D, 2A, 2B, 2C and 2D depict a structural enclosure breach such as a dent or a puncture in the battery case. The method of the present disclosure is also effective in detecting other breaches due to, for example, high temperatures. More specifically, in one alternative embodiment, if the HV battery is subjected to extremely high temperatures and the surface of the enclosure melts. In this embodiment, the high temperatures will affect the resistivity of the conduction path, thereby indicating that a change has occurred.

It should be appreciated that in various embodiments of the present disclosure, once a change in resistance from the initial resistance is detected, a signal such as an alarm, an indication to restart or shutdown the electrical system or some other appropriate signal is transmitted from the control module of the vehicle system. A change in the resistance along the conduction path is an indicator of the mechanical breach or distortion of the enclosure.

Figure 3:
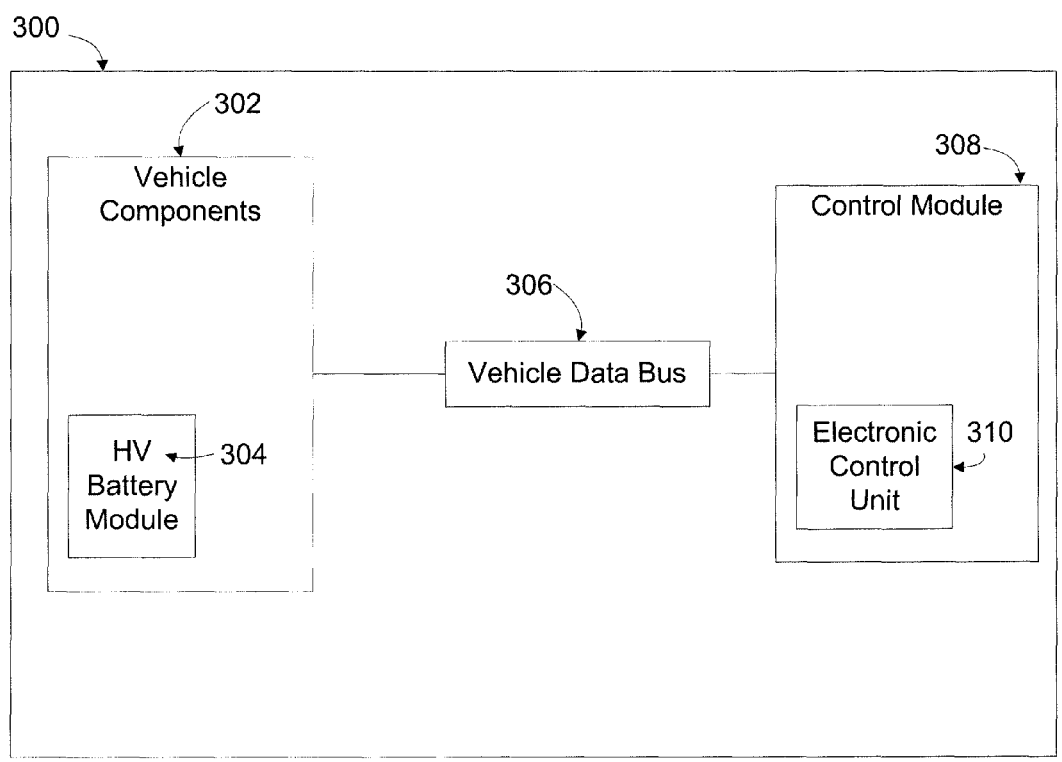
FIG. 3 depicts a schematic block diagram of an example vehicle system according to embodiments.

FIG. 3 represents a schematic block diagram of a vehicle system 300. The method and apparatus for assessing the structural integrity of vehicle components of the present disclosure can be implemented on any suitable structurally important surfaces on any type of vehicles such as for example any electrified vehicle including, but not limited to an electric vehicle, hybrid electric vehicle (HEV), plug-in electric vehicle (PHEV), or battery electric vehicle (BEV). The vehicle system 300 includes various vehicle components 302 such as a battery module which includes a battery pack 304. The vehicle system also includes a vehicle data bus 306. According to various embodiments of the present disclosure, the vehicle data bus 306 is a central electrical network that internally interconnects various components of the vehicle (e.g., engine control unit, transmission control unit, anti-lock braking system, body control modules, various sensors (e.g., temperature, speed, pressure, etc.), etc.). The vehicle data bus 306 allows these components to communicate, interact, and exchange data with each other. In some instances, the vehicle data bus 306 may also control one or more of the internal components.

As shown in FIG. 3, the vehicle system 300 further includes a control module 308, which includes an Electronic Control Unit 310 (also referred to herein as an "ECU") communicatively coupled to the various vehicle components 302 including the battery module 304. In some embodiments, the ECU 310 includes a microprocessor for controlling one or more vehicle components 302 of the vehicle system 300. In various embodiments of the present disclosure, the control module 308 can be configured to receive a signals regarding the various vehicle components within the vehicle system.

In various embodiments of the present disclosure, the ECU 310 of the vehicle is configured to monitor safety conditions involving the vehicle and/or the vehicle system 300, and is communicatively coupled to the control module 308. For example, in one embodiment, the ECU may be configured to send the alarm or shut down signals to the control module 308 and activate other vehicle safety features, including, for example, airbag inflation, and seat belt restraints. In some embodiments, the control module 308 may be included in the above-described ECU 310. In other embodiments, the control module 308 may be included in the vehicle bus 306 or the battery module 304.

In response to receiving certain signals, the control module 308 can be configured to send various alarm signals such as caution or warning signals, a signal to prevent start from off condition, a limited operating strategy signal (i.e., to reduced battery power), battery power off signal, restart signal, shut-down signal to disconnect the high voltage battery 304 from the vehicle bus 306 or shut down the electrical system of the vehicle.

In various embodiments of the present disclosure, the ECU 310 can be further configured to verify whether the change in resistance is minor or routine. The resistance of the conduction paths on the vehicle components could change for a number of reasons, including, for example, minor scratches near the mounting brackets, or a known, limited temperature change, or under certain conditions for testing the vehicle or the vehicle component. Upon determining that the resistance has changed, the ECU 310 may send a signal to disconnect the vehicle component from the rest of the vehicle bus 306 and the vehicle system 300.

Figure 4:
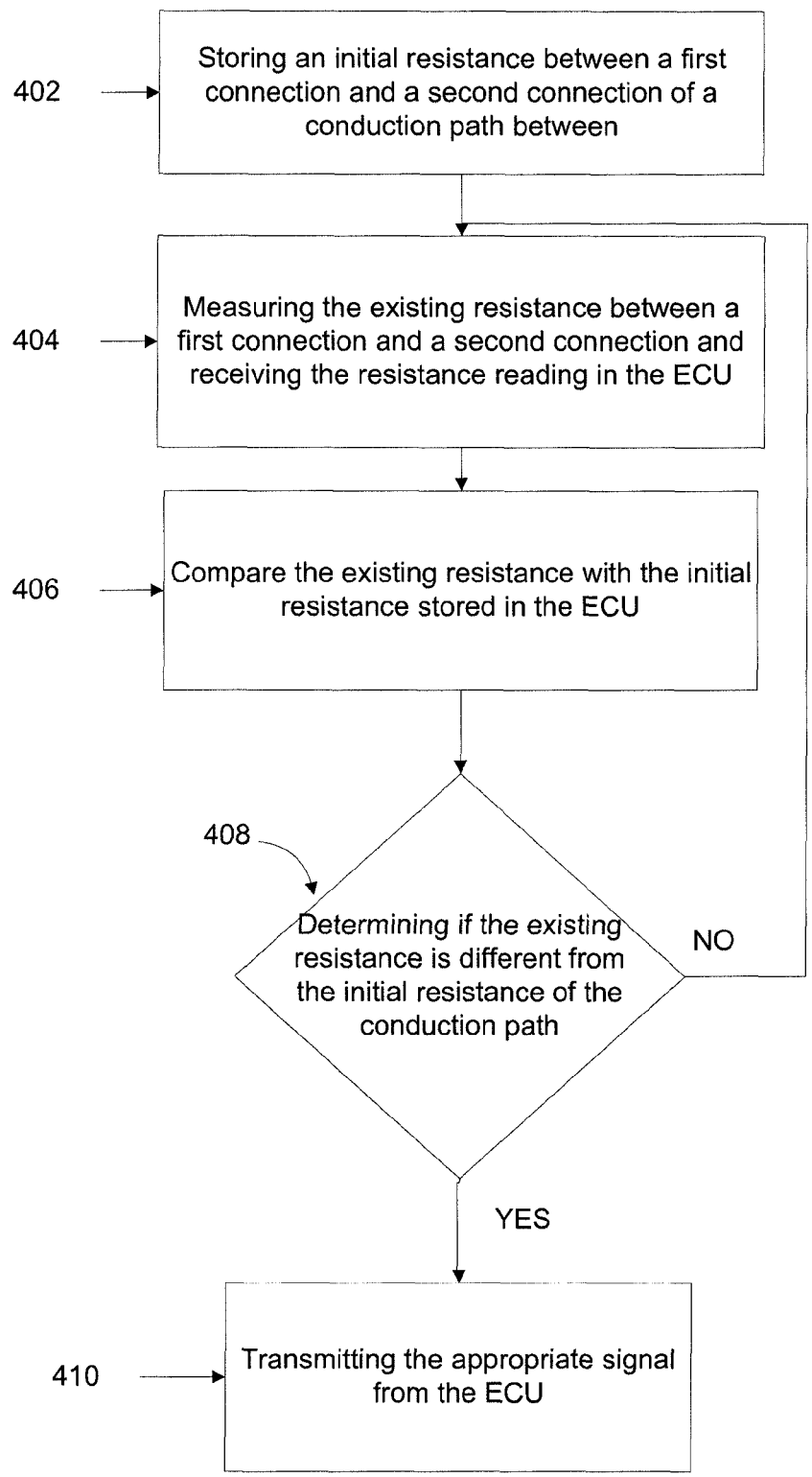
FIG. 4 depicts flow diagram of an example method of the present disclosure according to embodiments.

FIG. 4 depicts a flow diagram of an example method 400 for assessing the structural integrity of vehicle components, within a vehicle system (such as the vehicle system 300 shown above). FIG. 4 generally illustrates one embodiment of the process or method 400 of assessing the structural integrity of a vehicle component of the present disclosure. In various embodiments, method 400 is represented by a set of instructions stored in one or more memories and executed by one or more processors. More specifically, in this example embodiment, logic for implementing the method 400 can be stored in a memory (not shown) of a control module (such as the control module 308) of the vehicle system. Although method 400 is described with reference to the flowchart shown in FIG. 4, it should be appreciated that many other processes of performing the acts associated with this illustrated method 400 may be employed.

In this example embodiment, the vehicle component is an HV battery. As described above with respect to FIGS. 1A-1D, in this example embodiment, various conduction paths are applied to the HV battery pack enclosure and various connections are coupled to the conduction paths so that the resistance of the conduction path between a first connection and a second connection can be measured.

In this example embodiment, the method 400 includes storing the initial resistance of each conduction path between the first connection and the second connection, as indicated by block 402. In this example embodiment, the initial resistance is stored in a processor within the ECU. The method 400 then includes periodically measuring the existing resistance between the first connection and the second connection of each conduction path and receiving the existing resistance measurement to the ECU, as indicated by block 404. In the ECU, the method 400 includes comparing the received existing resistance reading to the stored initial resistance, as indicated by block 406. The method 400 then includes determining whether the existing resistance is different from the initial resistance of the conduction path. It should be appreciated that the resistance change may indicate a distortion in the conduction path correlating to a distortion to the battery case, as indicated by diamond 408. It should also be appreciated that the existing resistance measurement may reflect an open circuit, indicating that there is an actual break in the conduction path correlating to an actual break or puncture in the enclosure.

If there is no difference in the existing resistance from the initial resistance, the method 400 includes continuing measuring the existing resistance between the first connection and the second connection of the conduction path, as indicated by block 404.

If there is a difference in the existing resistance from the initial resistance, the method 400 includes transmitting the appropriate signal from the ECU to the appropriate system within the vehicle system, as indicated by block 410. It should be appreciated that this is based on logic within the controller. Depending on the degree of resistance change, the nature and degree of compromise of the structural integrity of the enclosure could be determined. Additionally, the number of sensors and conduction path changes would also inform the vehicle the location and severity of the potential compromise. In this manner the degree of resistance change, quantity of paths involved and their location could be used to assess severity. Based on this structural integrity determination, one of the common signals described above could be transmitted. In certain embodiments, the change in resistance is so insignificant that the structural integrity of the component is intact and thus, no resulting signal is transmitted.

It should be appreciated that in this example embodiment, the method 400 includes measuring the resistance between the first connection and the second connection every second. It should be appreciated that in certain alternative embodiments, the method 400 includes measuring the resistance less frequently than once every second. In other alternative embodiments, the method 400 includes measuring the resistance more frequently than once every second.

In certain alternative embodiments, the method includes measuring the resistance upon a triggering event such as a crash indication. More specifically, in certain alternative embodiments, a fault condition signal may be received which triggers an analysis of the structural integrity of certain vehicle components. In some embodiments, the fault condition signal may be received by the control module from an electronic control unit that monitors fault conditions within the vehicle.

It should also be appreciated that in the embodiments described above, the method of the present disclosure is applied to determine the structural integrity of an HV battery case, thereby verifying the structural integrity of the HV battery pack. It should be appreciated that the present application can be applied to a variety of structurally important vehicle surfaces, not just those surrounding high voltage components (or batteries for that matter). Any surface that if structurally compromised would not be easily observable (i.e., internal compromise to structural integrity that is not clearly revealed in an external vehicle inspection) could have electrical resistance measurements sensors added to it to detect structural integrity.

It should be appreciated that various alternative embodiments of the present disclosure include altering the quantity and the placement of the conduction paths and the sensors. It should be appreciated that with an increased quantity of conduction paths and connections such as sensors, the severity of the signals would need to be assessed differently. For example, in the example embodiment described above with respect to FIGS. 1A-1D, with only one connection on each surface of the enclosure, a broken connection is severe and would require immediate attention. On the other hand, in an alternative embodiment, with multiple connections on the same surface, if only one connection is broken, then the break might be less severe.

It should be appreciated that certain zones of the battery enclosure are more likely to be structurally compromised (i.e., the front side and rear) and the addition of multiple sensors can allow for the triangulation of the location and severity of the resistance (and correspondingly mechanical structure) change. This information would be feedback to the vehicle ECU to determine if the resistance change was minor and unimportant (i.e., scrating near the mounting brackets) or major.

Thus, the application describes systems and methods for assessing the structural integrity of vehicle components reliably and remotely and if necessary transmitting a fault condition signal, thereby eliminating the possibility of having a high voltage presence on the network. As will be appreciated, the systems and methods disclosed herein provide several advantages over conventional methods to assess the integrity of vehicle components such as HV battery systems. For example, by applying conduction paths the vehicle components, the apparatus and method of the present disclosure not only detect a change in the structural integrity of the vehicle component, but can also triangulate the location and the severity of the breach in the component. As such, the vehicle system can respond appropriately to ensure safety and avoid unnecessary alarms and system shut downs.

In the case of a minor crash, knowing that the structural integrity of the battery case has not been affected could lead to increased confidence in the reuseability of the battery pack. Avoiding the replacement of a still function battery pack due to the unknown nature of its mechanical case condition could be a significant cost savings.

Any process descriptions or blocks in the figures, such as FIG. 3, should be understood as representing modules, segments, or portions of code which include one or more executable instructions for implementing specific logical functions or steps in the process, and alternate implementations are included within the scope of the embodiments described herein, in which functions may be executed out of order from that shown or discussed, including substantially concurrently or in reverse order, depending on the functionality involved, as would be understood by those having ordinary skill in the art.

It should be emphasized that the above-described embodiments, particularly, any "preferred" embodiments, are possible examples of implementations, merely set forth for a clear understanding of the principles of the invention. Many variations and modifications may be made to the above-described embodiment(s) without substantially departing from the spirit and principles of the techniques described herein. All such modifications are intended to be included herein within the scope of this disclosure and protected by the following claims.

The invention claimed is:

1. A vehicle component structural integrity assessment system, comprising:
   a conduction path associated with a vehicle component;
   a first connection and a second connection coupled to the conduction path;
   a vehicle system control module configured to
      detect a change in a length of the conduction path between the first connection and the second connection; and
      determine a severity of a breach of the vehicle component based on the change of the length.

2. The structural integrity system of claim 1, wherein the first connection and the second connection are configured to transmit an existing resistance of the conduction path between the first connection and the second connection.

3. The structural integrity system of claim 1, wherein the conduction path is a wire of conductive material that is coupled to the vehicle component and extends between the first connection and the second connection.

4. The structural integrity system of claim 1, wherein the conduction path is associated with the vehicle component by being coupled to the vehicle component.

5. The structural integrity system of claim 2, wherein a vehicle data bus transmits the existing resistance measurement of the conduction path to the controller.

6. The structural integrity system of claim 1, wherein the vehicle component is a vehicle battery system.

7. The structural integrity system of claim 6, wherein the change in the length of the conduction path is a difference between an initial length measured prior to operation of the vehicle component and a subsequent length measured after the breach is formed in the vehicle component.

8. A method of assessing structural integrity of a vehicle component, comprising:
   measuring a length of a conduction path between a first connection and a second connection associated with the vehicle component; and
   at a vehicle system control module:
      detecting a change in the length of the conduction path; and
      determining a severity of a breach of the vehicle component based on the change of the length.

9. The method of claim 8, wherein the length of the conduction path is measured between the first connection and the second connection at a predetermined time interval.

10. The method of claim 8, wherein the first connection and the second connection are configured to transmit an existing resistance of the conduction path between the first connection and the second connection to measure the length of the conduction path.

11. The method of claim 8, wherein the conduction path is conductive material that extends from the first connection to the second connection.

12. The method of claim 8, wherein an initial length is the length of the conduction path between the first connection and the second connection prior to operation of the vehicle component.

13. The method of claim 12, further comprising storing the initial length of the conduction path in a processor in a control module.

14. The method of claim 8, further comprising determining whether the change in the length of the conduction path requires a signal to be transmitted from the controller.

15. The method of claim 8, wherein determining the severity of the breach of the vehicle component includes comparing an initial length of the conduction path measured prior to operation of the vehicle component and a subsequent length of the conduction path measured after formation of the breach.

16. The structural integrity system of claim 1, wherein the vehicle system control module determines that the breach is:
   a dent in the vehicle component when the change in the length of the conduction path is an increase in the length; and
   a puncture of the vehicle component when the change in the length of the conduction path is a decrease in the length.

17. The structural integrity system of claim 1, wherein, based on the change of the length of the conduction path, the vehicle system control module identifies that the breach of the vehicle component is located between the first connection and the second connection.

18. The method of claim 8, wherein determining the severity of the breach of the vehicle component includes identifying that the breach is a dent upon detecting the change in the length of the conduction path is an increase in the length.

19. The method of claim 18, wherein determining the severity of the breach of the vehicle component includes identifying that the breach is a puncture upon detecting the change in the length of the conduction path is a decrease in the length.

20. The method of claim 8, further including identifying, at the vehicle system control module, the breach of the vehicle component is located between the first connection and the second connection based on the change of the length of the conduction path.

* * * * *